United States Patent
Mokhlesi

(10) Patent No.: US 7,349,261 B2
(45) Date of Patent: Mar. 25, 2008

(54) METHOD FOR INCREASING PROGRAMMING SPEED FOR NON-VOLATILE MEMORY BY APPLYING COUNTER-TRANSITIONING WAVEFORMS TO WORD LINES

(75) Inventor: Nima Mokhlesi, Los Gatos, CA (US)

(73) Assignee: SanDisk Corporation, Milipitas, CA (US)

( * ) Notice: Subject to any disclaimer, the term of this patent is extended or adjusted under 35 U.S.C. 154(b) by 0 days.

(21) Appl. No.: 11/425,024

(22) Filed: Jun. 19, 2006

(65) Prior Publication Data

US 2007/0291543 A1 Dec. 20, 2007

(51) Int. Cl.
G11C 16/04 (2006.01)
G11C 16/06 (2006.01)

(52) U.S. Cl. .......................... 365/185.18; 365/185.02; 365/185.22; 365/185.28

(58) Field of Classification Search ........... 365/185.02, 365/185.18, 185.19, 185.22, 185.23, 185.28
See application file for complete search history.

(56) References Cited

U.S. PATENT DOCUMENTS

| | | | |
|---|---|---|---|
| 5,043,940 | A | 8/1991 | Harari |
| 5,172,338 | A | 12/1992 | Mehrotra |
| 5,386,422 | A | 1/1995 | Endoh |
| 5,522,580 | A | 6/1996 | Varner, Jr. |
| 5,570,315 | A | 10/1996 | Tanaka |
| 5,621,684 | A | 4/1997 | Jung |
| 5,677,873 | A | 10/1997 | Choi |
| 5,715,194 | A | 2/1998 | Hu |
| 5,774,397 | A | 6/1998 | Endoh |
| 5,887,145 | A | 3/1999 | Harari |
| 5,973,962 | A | 10/1999 | Kwon |
| 5,991,202 | A | 11/1999 | Derhacobian |
| 6,011,287 | A | 1/2000 | Itoh |

(Continued)

FOREIGN PATENT DOCUMENTS

EP 0566306 10/1993

(Continued)

OTHER PUBLICATIONS

S. Aritome et al., "Reliability Issues of Flash Memory Cells," Proceedings of the IEEE, New York, vol. 81, No. 5, May 1, 1993, pp. 776-788.

(Continued)

*Primary Examiner*—Huan Hoang
*Assistant Examiner*—Ly Duy Pham
(74) *Attorney, Agent, or Firm*—Vierra Magen Marcus & DeNiro LLP

(57) ABSTRACT

Non-volatile storage elements are programmed using counter-transitioning waveform portions on neighboring word lines which reduce capacitive coupling to a selected word line. In one approach, the waveform portions extend between pass or isolation voltages of a boosting mode, which are applied during a programming pulse on the selected word line, and read voltages, which are applied when verify pulses are applied to the selected word line to verify whether the storage elements have been programmed to a desired programming state. The waveform portions reduce the net voltage change which is coupled to the selected word line. The selected word line can reach a reduced, steady state level sooner so that the verify pulses can be applied sooner, thus reducing the overall programming time.

11 Claims, 11 Drawing Sheets

U.S. PATENT DOCUMENTS

| | | |
|---|---|---|
| 6,046,935 A | 4/2000 | Takeuchi |
| 6,049,494 A | 4/2000 | Sakui |
| 6,061,270 A | 5/2000 | Choi |
| 6,107,658 A | 8/2000 | Itoh |
| 6,181,599 B1 | 1/2001 | Gongwer |
| 6,222,762 B1 | 4/2001 | Guterman |
| 6,252,798 B1 * | 6/2001 | Satoh et al. ............ 365/185.02 |
| 6,456,528 B1 | 9/2002 | Chen |
| 6,522,580 B2 | 2/2003 | Chen |
| 6,525,964 B2 | 2/2003 | Tanaka |
| 6,614,688 B2 | 9/2003 | Jeong |
| 6,646,300 B2 | 11/2003 | Ishii |
| 6,804,150 B2 * | 10/2004 | Park et al. ............. 365/185.18 |
| 6,859,397 B2 | 2/2005 | Lutze |
| 7,046,568 B2 | 5/2006 | Cernea |
| 7,196,928 B2 | 3/2007 | Chen |
| 2002/0110019 A1 | 8/2002 | Satoh |
| 2002/0126532 A1 | 9/2002 | Matsunaga |
| 2003/0147278 A1 | 8/2003 | Tanaka |
| 2004/0057287 A1 | 3/2004 | Cernea |
| 2004/0109357 A1 | 6/2004 | Cernea |
| 2004/0255090 A1 | 12/2004 | Guterman |
| 2005/0024939 A1 | 2/2005 | Chen |
| 2005/0174852 A1 | 8/2005 | Hemink |
| 2005/0213385 A1 | 9/2005 | Hosono |
| 2005/0226055 A1 | 10/2005 | Guterman |
| 2006/0126390 A1 | 6/2006 | Gorobets |
| 2006/0140007 A1 | 6/2006 | Cernea |
| 2006/0158947 A1 | 7/2006 | Chan |

FOREIGN PATENT DOCUMENTS

| | | |
|---|---|---|
| EP | 0626645 | 11/1994 |
| EP | 0991075 | 4/2000 |
| EP | 1274096 | 1/2003 |

OTHER PUBLICATIONS

Jung, et al., "A 3.3V 128Mb Multi-Level NAND Flash Memory for Mass Storage Applications," ISSCC96, Session 2, Flash Memory, Paper TP 2.1, IEEE, pp. 32-33, slide supplement pp. 20-21, 346-347 (1996).

Jung, et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

A. Modelli et al., "Basic feasibility constraints for multilevel CHE-programmed flashmemories," IEE Trans. on Electron Devices, vol. 48, No. 9, Sep. 2001, pp. 2032-2042.

T. Nozaki, et al., "A 1-Mb EEPROM with MONOS Memory Cell for Semiconductor Disk Application," IEEE Journal of Solid-State Circuits, vol. 26, No. 4 Apr. 1991, pp. 497-501.

K.D. Suh, et al., "A 3.3V 32 Mb NAND Flash Memory with Incremental Step Pulse Programming Scheme," Journal of Solid-State Circuits, vol. 30, No. 11, Nov. 1995, pp. 1149-1155.

U.S. Appl. No. 11/425,045, filed Jun. 19, 2006, titled System for Increasing Programming Speed for Non-Volatile Memory by Applying Counter-Transitioning Waveforms to Word Lines, by Mokhlesi.

* cited by examiner

METHOD FOR INCREASING PROGRAMMING SPEED FOR NON-VOLATILE MEMORY BY APPLYING COUNTER-TRANSITIONING WAVEFORMS TO WORD LINES

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have storage elements which use a floating gate to store two ranges of charges and, therefore, can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the storage element can be placed in one of four discrete charge bands corresponding to four distinct threshold voltage ranges.

Typically, a program voltage (Vpgm) applied to the control gate during a program operation is applied as a series of pulses that increase in magnitude over time. In one possible approach, the magnitude of the pulses is increased with each successive pulse by a predetermined step size, e.g., 0.2-0.4 V. Vpgm can be applied to the control gates of flash storage elements. In the periods between the program pulses, verify operations are carried out. That is, the programming level of each storage element of a set of storage elements being programmed in parallel is read between successive programming pulses to determine whether it is equal to or greater than a verify level to which the storage element is being programmed. For arrays of multi-state flash storage elements, a verification step may be performed for each state of a storage element to determine whether the storage element has reached its data-associated verify level. For example, a multi-state storage element capable of storing data in four states may need to perform verify operations for three compare points.

When programming an EEPROM or flash memory device, such as a NAND flash memory device, typically the program voltage is applied to the control gate and the bit line is grounded, causing electrons from the channel of a storage element to be injected into the floating gate. When electrons accumulate in the floating gate, the floating gate becomes negatively charged and the threshold voltage of the storage element is raised so that the storage element is in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," both of which are incorporated herein by reference in their entirety.

However, during programming, voltage waveforms which are applied to neighboring word lines can be capacitively coupled to the selected word line on which programming occurs. In particular, voltage transitions in the neighboring word lines can cause a ripple voltage in the selected world line when various boosting modes are used. This negatively impacts the programming process. For example, the verification process, in which one or more verify pulses are applied to the selected word line for verifying whether the storage elements have been programmed to the intended programming state, is delayed until after the ripple voltage has diminished, resulting in a longer programming time. A technique is need for programming non-volatile storage elements which addresses the above and other issues.

SUMMARY OF THE INVENTION

The present invention provides a method and system for operating non-volatile storage in a manner which increases programming speed.

In one embodiment, non-volatile storage is operated by applying a first voltage waveform to a first word line associated with non-volatile storage elements, where the first voltage waveform includes a programming voltage, and a transition from the programming voltage to a reduced level. When the first voltage waveform transitions to the reduced level, a portion of a second voltage waveform is applied to a second word line which neighbors the first word line on one side, and a portion of a third voltage waveform is applied to a third word line which neighbors the first word line on another side, where the portions of the second and third voltage waveforms are counter-transitioning. That is, one portion increases while the other decreases. As a result, the capacitive coupling of the second voltage waveform to the first word line is counteracted, at least in part, by a capacitive coupling of the third voltage waveform to the first word line.

In another embodiment, non-volatile storage is operated by programming non-volatile storage elements associated with a first word line by applying a first voltage waveform to the first word line. The first voltage waveform includes a first programming voltage during a first time interval, a reduced voltage during a second time interval which follows the first time interval, and at least one verify voltage during a third time interval which follows the second time interval. A second voltage waveform is applied to a second word line, where the second voltage waveform includes associated voltages during the first, second and third time intervals. The associated voltage during the second time interval represents a direct transition between the associated voltage during the first time interval and the associated voltage during the third time interval. The associated voltage during the first time interval can be greater than or the same as the associated voltage during the third time interval.

In yet another embodiment, non-volatile storage is operated by programming non-volatile storage elements associated with a first word line by applying a first voltage waveform to the first word line. The first voltage waveform includes a first programming voltage during a first time interval, a reduced voltage during a second time interval which follows the first time interval, and at least one verify voltage during a third time interval which follows the second time interval. A second voltage waveform is applied to a second word line which neighbors the first word line on one side, where the second voltage waveform includes an associated voltage during the first time interval, a transitioning voltage during the second time interval which is capacitively coupled to the first word line, and an associated voltage during the third time interval. A third voltage waveform is applied to a third word line which neighbors the first word line on another side, where the third voltage waveform includes an associated voltage during the first time interval, a transitioning voltage during the second time interval which is capacitively coupled to the first word line, and an associated voltage during the third time interval. The capacitive coupling caused by the transitioning voltage of the second voltage waveform counteracts, at least in part, the capacitive coupling caused by the transitioning voltage of the third voltage waveform.

Corresponding methods for operating non-volatile storage and non-volatile storage systems are provided. The non-volatile storage systems include a set of non-volatile storage elements, and one or more circuits for operating the set of non-volatile storage elements as discussed herein.

DETAILED DESCRIPTION

Figure 1:
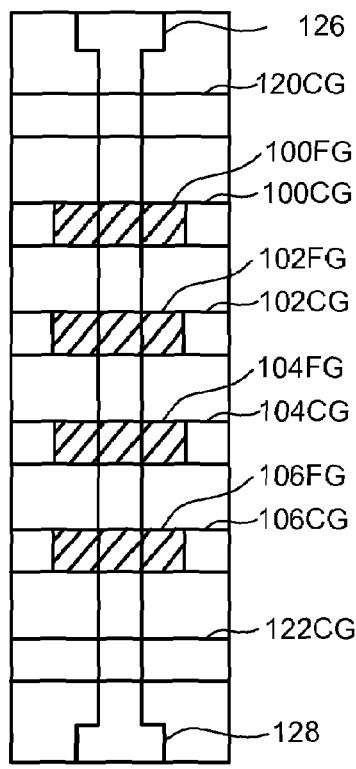
FIG. 1 is a top view of a NAND string.
Figure 2:
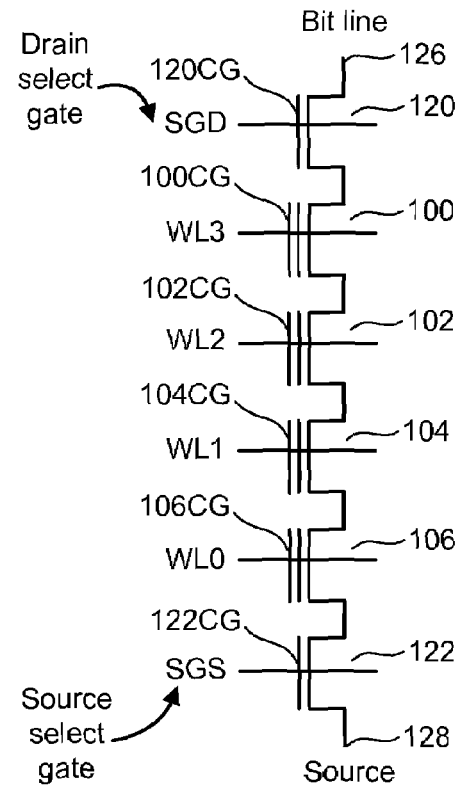
FIG. 2 is an equivalent circuit diagram of the NAND string of FIG. 1.

One example of a non-volatile memory system suitable for implementing the present invention uses a NAND flash memory structure, in which multiple transistors are arranged in series between two select gates in a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Specifically, transistors 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each storage elements, also referred to as cells or storage elements. In other designs, the storage elements may include multiple transistors or may be different than those depicted in FIGS. 1 and 2. Select gate 120 is connected to drain select line SGD, while select gate 122 is connected to source select line SGS.

Figure 3:
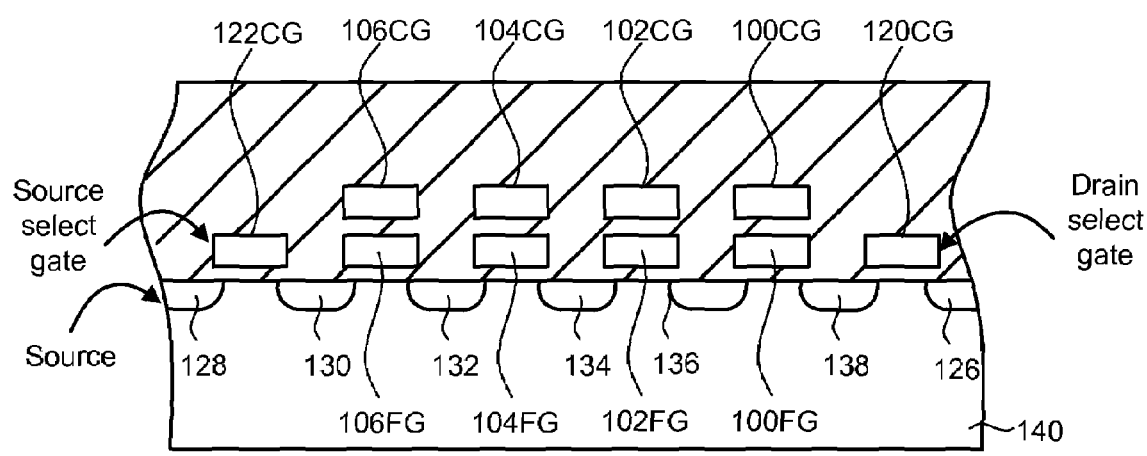
FIG. 3 is a cross-sectional view of the NAND string of FIG. 1.

FIG. 3 provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the storage elements (100, 102, 104 and 106) form the word lines. N+ doped layers 130, 132, 134, 136 and 138 are shared between neighboring storage elements, whereby the storage elements are connected to one another in series to form the NAND string. These N+ doped layers form the source and drain of each of the storage elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

The use of four transistors in a NAND string in FIGS. 1-3 is provided only as an example, as a NAND string used with the technology described herein can have less than or more than four storage elements. For example, some NAND strings will include eight, sixteen, thirty-two, sixty-four or more storage elements.

The invention can be used with devices that are programmed and erased by Fowler-Nordheim tunneling, for instance. The invention is also applicable to devices that use a triple layer dielectric such as a dielectric formed of silicon oxide, silicon nitride and silicon oxide (ONO) to store charges instead of a floating gate. A triple layer dielectric formed of ONO is sandwiched between a conductive control gate and a surface of a semi-conductive substrate above the storage element channel. The invention can also be applied to devices that use, for example, small islands of conducting materials such as nano crystals as charge storage regions instead of floating gates. Such memory devices can be programmed and erased in a similar way as floating gate based NAND flash devices.

Figure 4:
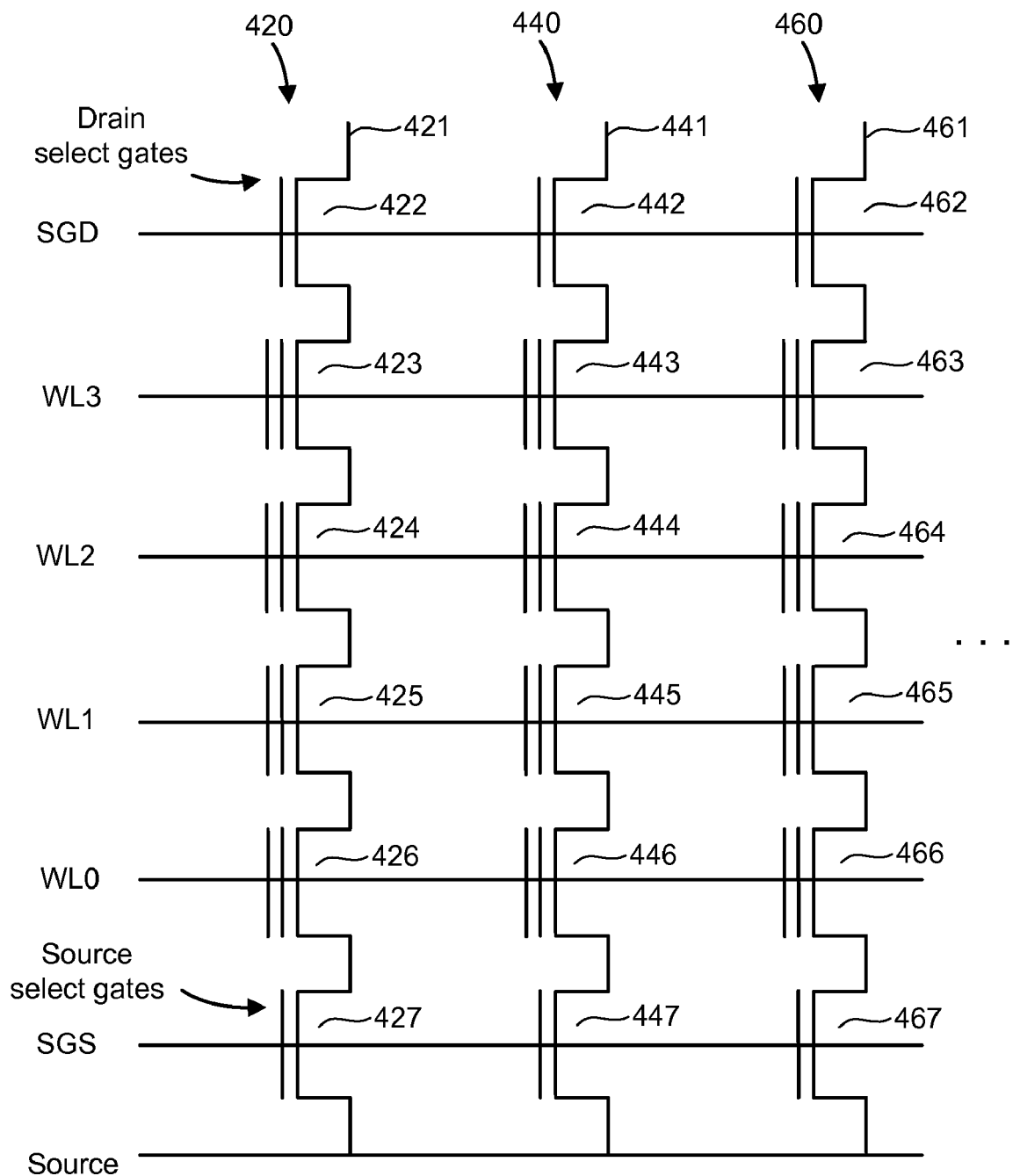
FIG. 4 is a circuit diagram depicting three NAND strings.

FIG. 4 is a circuit diagram depicting three NAND strings. A typical architecture for a flash memory system using a NAND structure will include several NAND strings. For example, three NAND strings 420, 440 and 460 are shown in a memory array having many more NAND strings. Each of the NAND strings includes two select transistors and four storage elements. For example, NAND string 420 includes select transistors 422 and 427, and storage elements 423-426, NAND string 440 includes select transistors 442 and 447, and storage elements 443-446, NAND string 460 includes select transistors 462 and 467, and storage elements 463-466. Each NAND string is connected to the source line by its select transistor (e.g., select transistor 427, 447 or 467). A selection line SGS is used to control the source side select gates. The various NAND strings 420, 440 and 460 are connected to respective bit lines 421, 441 and 461, by select transistors 422, 442, 462, etc., which are controlled by drain select line SGD. In other embodiments, the select lines do not necessarily need to be in common. Word line WL3 is connected to the control gates for storage elements 423, 443 and 463. Word line WL2 is connected to the control gates for storage elements 424, 444 and 464. Word line WL1 is connected to the control gates for storage elements 425, 445 and 465. Word line WL0 is connected to the control gates for storage elements 426, 446 and 466. As can be seen, each bit line and the respective NAND string comprise the columns of the array or set of storage elements. The word lines (WL3, WL2, WL1 and WL0) comprise the rows of the array or set. Each word line connects the control gates of each storage element in the row. For example, word line WL2 is connected to the control gates for storage elements 424, 444 and 464. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Publication 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, that word line is also connected to one storage element in each of the other NAND strings that share the same word line. For example, when programming storage element 424 of FIG. 4, the program voltage will also be applied to the control gates of storage elements 444 and 464.

However, shifts in the charged stored in a storage element can occur when programming and reading a given storage element and other storage elements which have some degree of coupling with the given storage element, such as those sharing the same word line or bit line. Specifically, shifts in the stored charge levels occur because of field coupling between storage elements. The problem is exacerbated as the spaces between storage elements are being decreased due to improvements in integrated circuit manufacturing techniques. The problem occurs most markedly between two groups of adjacent storage elements that have been programmed at different times. One group of storage elements is programmed to add a level of charge that corresponds to one set of data. After a second group of storage elements is programmed with a second set of data, the charge levels read from the first group of storage elements often appear to be different than what was programmed due to capacitive coupling of the charges of the second group of storage elements to the first group of storage elements. Thus, the effects of coupling depend on the order in which the storage elements are programmed and, therefore, the order in which the word lines are traversed during programming. A NAND string is typically, but not always, programmed from the source side to the drain side, starting at the source side word line and proceeding, one word line at a time, to the drain side word line.

Capacitive coupling effects on a given storage element can be caused by other storage elements in the same word line and in the same NAND string, for instance. For example, storage element 444 may be part of a first group of storage elements, which includes other alternating storage elements along word line WL2, which store a page of data. Storage elements 424 and 464 may be part of a second group of storage elements which store another page of data. When the second group of storage elements are programmed after storage element 444, there will be a capacitive coupling to storage element 444. The coupling is strongest from the direct neighboring storage elements on the word line, which are storage elements 424 and 464.

Similarly, storage element 444 can be affected by programming of storage elements which are on the same NAND string 440 if they are programmed after storage element 444. For storage element 444, the coupling is strongest from the direct neighboring storage elements on the NAND string, which are storage elements 443 and/or 445. For example, if storage elements in the NAND string 440 are programmed in the order: 446, 445, 444, 443, storage element 444 can be affected by coupling from storage element 443. Generally, storage elements which are arranged diagonally with respect to storage element 444, namely storage elements 423, 463, 425 and 465, can provide about 20% of the coupling for storage element 444, whereas the direct neighboring storage elements 424 and 464, and 443 and 445 on the same word line or NAND string provide about 80% of the coupling. The coupling may be enough to shift the $V_{TH}$ of a storage element by about 0.5 V in some cases, which is sufficient to cause a read error and to widen the $V_{TH}$ distribution of a group of storage elements.

Figure 5:
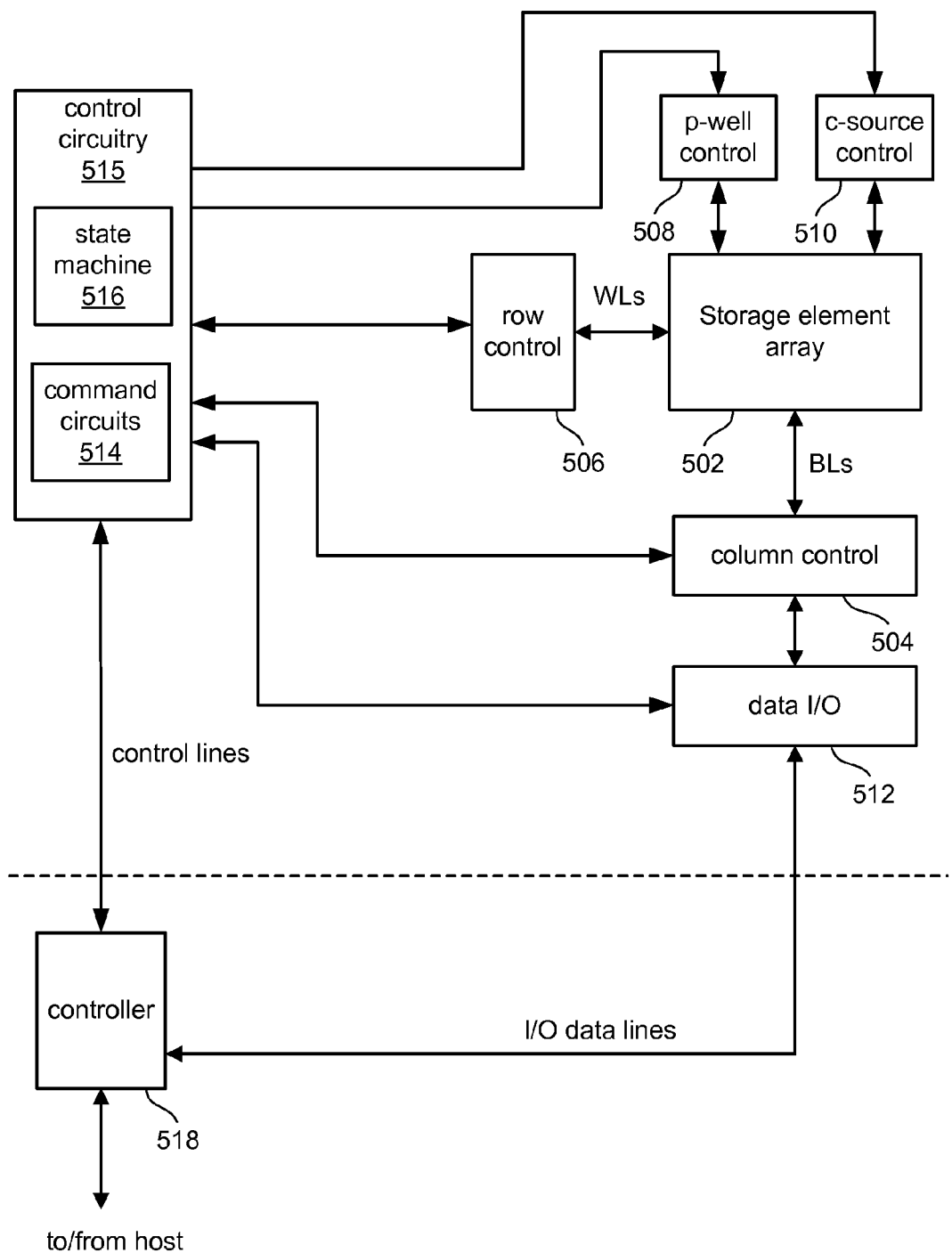
FIG. 5 is a block diagram of an example flash memory system that can be used to implement one or more embodiments of the present disclosure.

FIG. 5 is a block diagram of one embodiment of a flash memory system that can be used to implement one or more embodiments of the present disclosure. Other systems and implementations can be used as well. Storage element array 502 is controlled by column control circuit 504, row control circuit 506, c-source control circuit 510 and p-well control circuit 508. Column control circuit 504 is connected to the bit lines of storage element array 502 for reading data stored in the storage elements, for determining a state of the storage elements during a program operation, and for controlling potential levels of the bit lines to promote or inhibit programming and erasing. Row control circuit 506 is connected to the word lines to select one of the word lines, to apply read voltages, to apply program voltages combined with the bit line potential levels controlled by column control circuit 504, and to apply an erase voltage. C-source control circuit 510 controls a common source line (labeled as "c-source" in FIG. 6) connected to the storage elements. P-well control circuit 508 controls the p-well voltage.

The data stored in the storage elements is read out by the column control circuit 504 and output to external I/O lines via data input/output buffer 512. Program data to be stored in the storage elements are input to the data input/output buffer 512 via the external I/O lines, and transferred to the column control circuit 504. The external I/O lines are connected to controller 518.

Command data for controlling the flash memory device is input to controller 518. The command data informs the flash memory of what operation is requested. The input command is transferred to state machine 516 which is part of control circuitry 515. State machine 516 controls column control circuit 504, row control circuit 506, c-source control 510, p-well control circuit 508 and data input/output buffer 512. State machine 516 can also output status data of the flash memory such as READY/BUSY or PASS/FAIL.

Controller 518 is connected to or connectable with a host system such as a personal computer, digital camera, personal digital assistant of the like. It communicates with the host that initiates commands, such as to store or read data to or from the memory array 502, and provides or receives such data. Controller 518 converts such commands into command signals that can be interpreted and executed by command circuits 514 which are part of control circuitry 515. Command circuits 514 are in communication with state machine 516. Controller 518 typically contains buffer memory for the user data being written to or read from the storage element array 502.

One exemplary memory system includes one integrated circuit that includes controller 518, and one or more integrated circuit chips that each contains a memory array and associated control, input/output and state machine circuits. There is a trend to integrate the memory arrays and controller circuits of a system together on one or more integrated circuit chips. The memory system may be embedded as part of the host system, or may be included in a memory card or other package that is removably inserted into the host systems. Such a card may include the entire memory system, e.g., including the controller, or just the memory array(s) with associated peripheral circuits, with the controller or control function being embedded in the host. Thus, the controller can be embedded in the host or included within the removable memory system.

In some implementations, some of the components of FIG. 5 can be combined. Further, in various designs, one or more of the components of FIG. 5, other than the storage element array 502, can be thought of as a managing circuit. For example, one or more managing circuits may include any one of, or a combination of, control circuitry, a command circuit, a state machine, a row control circuit, a column control circuit, a well control circuit, a source control circuit and a data I/O circuit.

Figure 6:
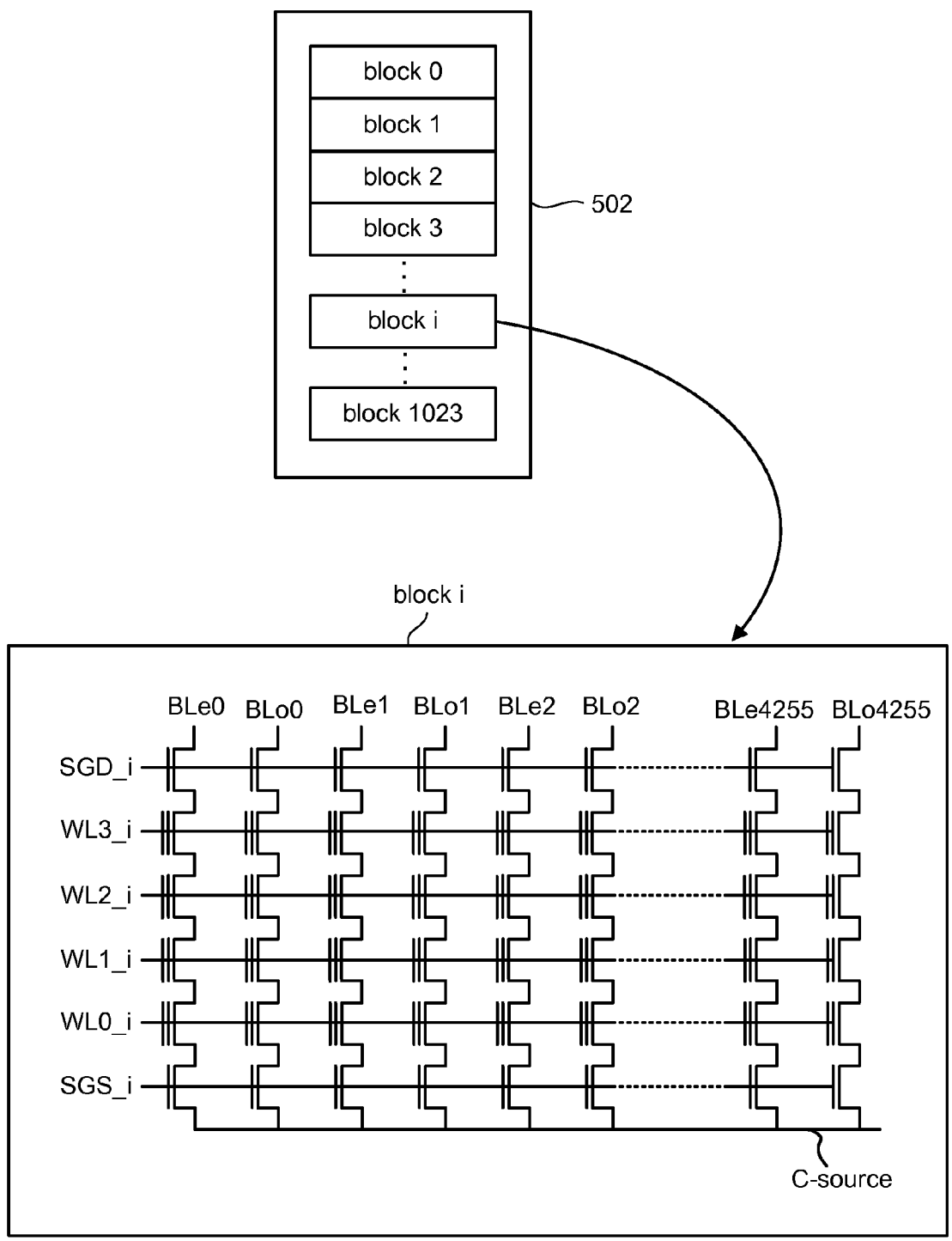
FIG. 6 illustrates an example of an organization of a memory array into blocks.

FIG. 6 provides an example structure of the storage element array 502 of FIG. 5. A NAND flash EEPROM is described that is partitioned into 1,024 blocks. Data can be programmed into different blocks and read from different blocks concurrently. In an erase operation, the data stored in each block is simultaneously erased. In one design, the block is the minimum unit of storage elements that are simultaneously erased. In each block, in this example, there are 8,512 columns that are divided into even columns and odd columns. The bit lines are also divided into even bit lines (BLe) and odd bit lines (BLo). Four storage elements are shown connected in series to form a NAND string. Although four storage elements are shown to be included in each NAND string, more or fewer than four storage elements can be used. Typically, up to 32 or 64 storage elements can be provided in each NAND string. One terminal of the NAND string is connected to a corresponding bit line via a select transistor SGD, and another terminal is connected to the c-source line via a second select transistor SGS.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used. Additionally, architectures other than those of FIGS. 5 and 5 can be used. For example, in one design, the bit lines are not divided into odd and even bit lines so that all bit lines can be programmed and read concurrently (or not concurrently).

Storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bitline. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one approach, a page is a unit of programming. In some implementations, the individual pages may be divided into segments and the segments may contain the fewest number of storage elements that are written at one time as a basic programming operation. One or more pages of data are typically stored in one row of storage elements. A page can store one or more sectors. A sector includes user data and overhead data, such as an Error Correcting Code (ECC) that has been calculated from the user data of the sector. A portion of the controller calculates the ECC when data is being programmed into the array, and also checks the data using the ECC when the data is read from the array. Alternatively, the ECCs and/or other overhead data are stored in different pages, or even different blocks, than the user data to which they pertain. In other designs, other parts of the memory device, such as the state machine, can calculate the ECC.

A sector of user data is typically 512 bytes, corresponding to the size of a sector in magnetic disk drives. Overhead data is typically an additional 16-20 bytes. A block can includes a number of pages, e.g., 8, 32, 64 or more pages.

Figure 7:
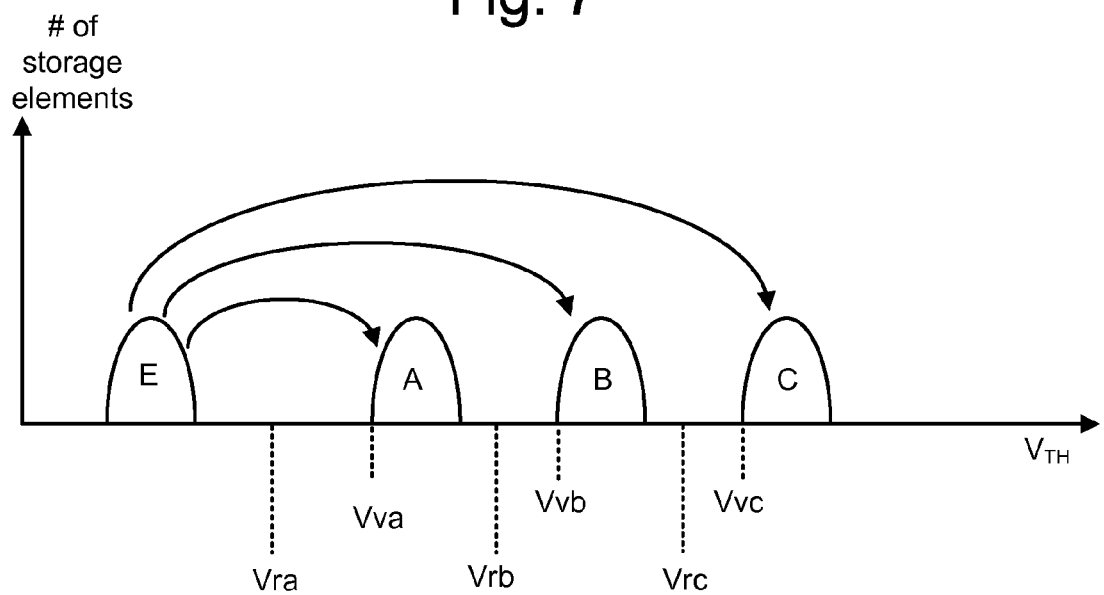
FIG. 7 depicts an example set of threshold voltage distributions in a multi-state device with direct programming from the erased state to a programmed state.

FIG. 7 depicts an example set of $V_{TH}$ distributions in a multi-state device with direct programming from the erased state to a programmed state. In this case, each storage element stores two bits of data in four data states represented by E, A, B and C. E depicts a first $V_{TH}$ distribution for erased storage elements, while A, B and C depict three $V_{TH}$ distributions for programmed storage elements. In one design, the $V_{TH}$ values in the E distribution are negative and the $V_{TH}$ values in the A, B and C distributions are positive. Each distinct $V_{TH}$ range corresponds to predetermined values for the set of data bits. The specific relationship between the data programmed into the storage element and the $V_{TH}$ levels of the storage element depends upon the data encoding scheme adopted for the storage elements. One example assigns "11" to the $V_{TH}$ range E (state E), "10" to the $V_{TH}$ range A (state A), "00" to the $V_{TH}$ range B (state B) and "01" to the $V_{TH}$ range C (state C). However, in other designs, other schemes are used.

A set of three read reference voltages, Vra, Vrb and Vrc, is used for reading data from storage elements after programming. By testing whether the $V_{TH}$ of a given storage element is above or below Vra, Vrb and Vrc, the system can determine the state of the storage element. A set of three verify reference threshold voltages, Vva, Vvb and Vvc, which is used during programming, is also indicated. When programming storage elements to state A, B or C, the system will test whether those storage elements have a $V_{TH}$ greater than or equal to Vva, Vvb or Vvc, respectively.

In one approach, known as full sequence programming, storage elements can be programmed from the erase state E directly to any of the programmed states A, B or C, as depicted by the curved arrows. For example, a population of storage elements to be programmed, such as a block, may first be erased so that all storage elements in the population are in the erased state E. While some storage elements are being programmed from state E to state A, other storage elements are being programmed from state E to state B and/or from state E to state C.

Figure 8:
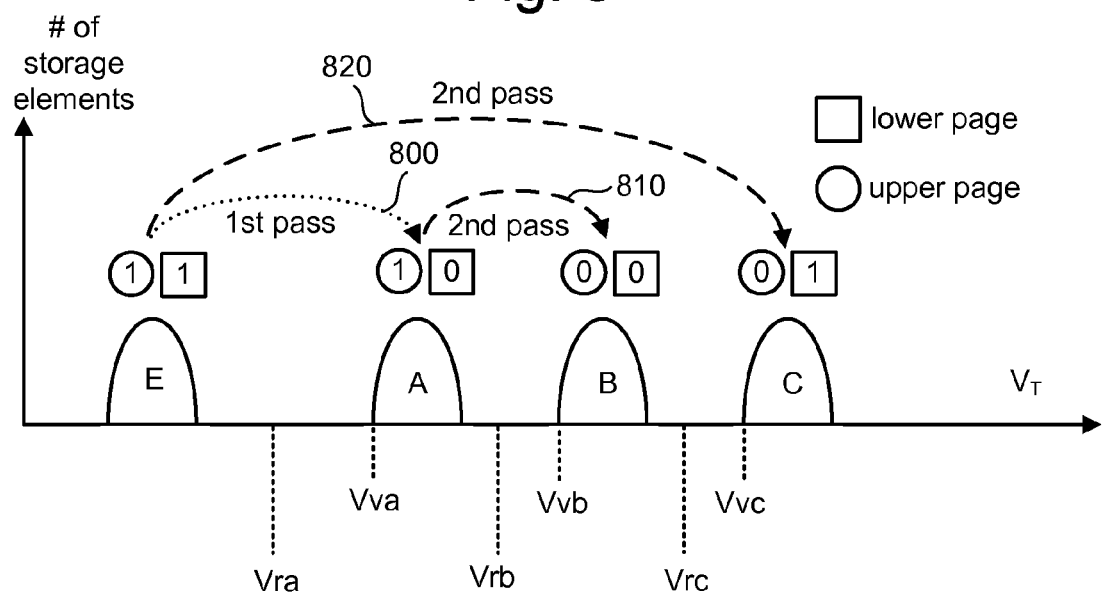
FIG. 8 depicts an example of a two-pass technique of programming a multi-state storage element that stores data for two different pages of data

FIG. 8 illustrates an example of a two-pass technique of programming a multi-state storage element that stores data for two different pages of data: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Although specific bit patterns have been assigned to each of the states, different bit patterns may also be assigned. In a first programming pass, the storage element's $V_{TH}$ level is set according to the bit to be programmed into the lower logical page. If that bit is a logic "1," the $V_{TH}$ is not changed since it is in the appropriate state as a result of having been previously erased. However, if the bit to be programmed is a logic "0," the threshold level of the storage element is increased to be state A, as shown by arrow 800.

In a second pass, the storage element's $V_{TH}$ level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the $V_{TH}$ is shifted. If the first step resulted in the storage element remaining in the erased state E, then, in the second phase, the storage element is programmed so that the $V_{TH}$ is increased to be within state C, as depicted by arrow 820. If the storage element had been programmed into state A as a result of the first programming pass, then the storage element is further programmed in the second step so that the $V_{TH}$ is increased to be within state B, as depicted by arrow 810. The result of the second pass is to program the storage element into the state designated to store a logic "0" for the upper page without changing the data for the lower page.

In one approach, a system can be set up to perform full sequence writing if enough data is written to fill up an entire page. If not enough data is written for a full page, then the programming process can program the lower page with the data received. When subsequent data is received, the system will then program the upper page. In yet another approach, the system can start writing in the mode that programs the lower page and convert to full sequence programming mode if enough data is subsequently received to fill up all, or most of, a word line's storage elements. More details of such an approach are disclosed in U.S. patent application Ser. No. 11/013,125, titled "Pipelined Programming of Non-Volatile Memories Using Early Data," filed on Dec. 14, 2004 by inventors Sergy A. Gorobets and Yan Li, and incorporated herein by reference in its entirety.

Figure 9A:
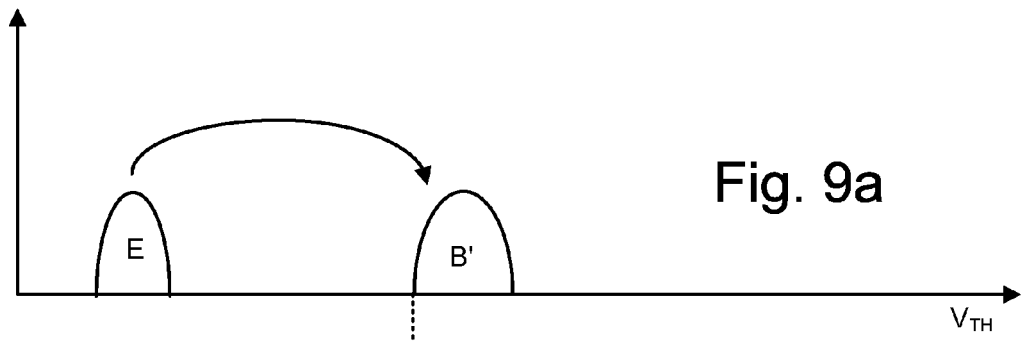
FIGS. 9*a-c* depict an example set of threshold voltage distributions in a multi-state device with two-step programming from the erased state to an intermediate state in a first step, and from the erased state to a first state "A", and from the intermediate state to a second state "B" or a third state "C", in a second step.
Figure 9B:
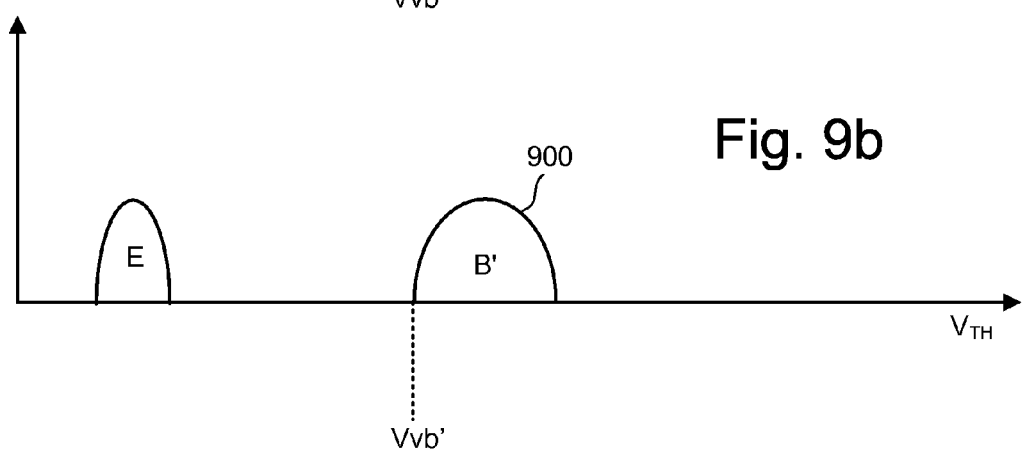
Figure 9C:
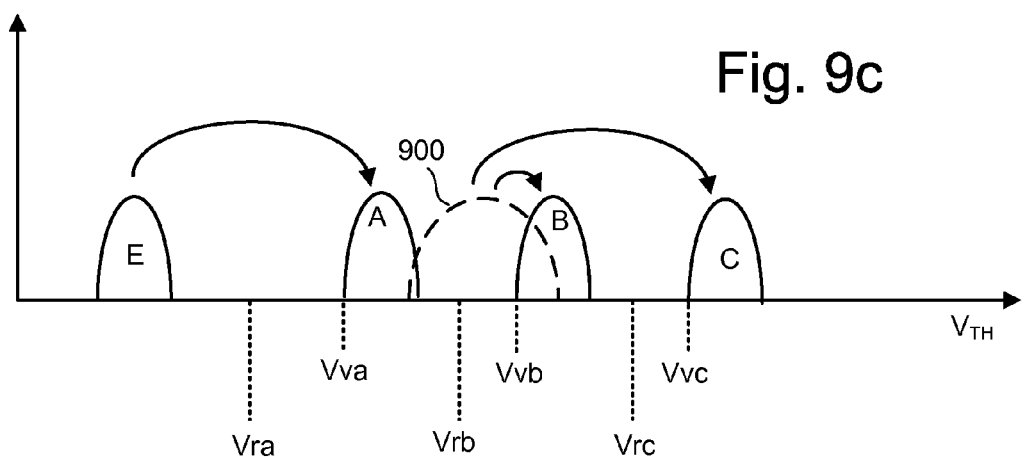

FIGS. 9a-c depict another process for programming non-volatile memory that reduces floating gate-to-floating gate coupling by, for any particular storage element, writing to that particular storage element with respect to a particular page subsequent to writing to adjacent storage elements for previous pages.

In one example implementation, each of the non-volatile storage elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each storage element stores bits from two pages of data. For reference purposes these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The programming process has two steps. In the first step, the lower page is programmed. If the lower page is to remain data 1, then the storage element state remains at state E. If the data is to be programmed to 0, then the $V_{TH}$ of the storage element is raised such that the storage element is programmed to state B'. FIG. 9a therefore shows the programming of storage elements from state E to state B', which represents an interim state B; therefore, the verify point is depicted as Vvb', which is lower than Vvb, depicted in FIG. 9c.

In one design, after a storage element is programmed from state E to state B', its neighbor storage element on an adjacent word line is programmed with respect to its lower page. After programming the neighbor storage element, the floating gate-to-floating gate coupling effect will raise the apparent $V_{TH}$ of storage element under consideration, which is in state B'. This will have the effect of widening the $V_{TH}$ distribution for state B' to that depicted in FIG. 9b. This apparent widening of the $V_{TH}$ distribution will be remedied, at least in part, when programming the upper page.

FIG. 9c depicts the process of programming the upper page. If the storage element is in erased state E and the upper page is to remain at 1, then the storage element will remain in state E. If the storage element is in state E and its upper page data is to be programmed to 0, the $V_{TH}$ of the storage element will be raised so that the storage element is in state A. If the storage element is in state B' with the intermediate $V_{TH}$ distribution and the upper page data is to remain at 1, the storage element will be programmed to final state B. If the storage element is in state B' with the intermediate $V_{TH}$ distribution and the upper page data is to become data 0, the $V_{TH}$ of the storage element will be raised so that the storage element is in state C. The process depicted by FIGS. 9a-c reduces the effect of floating gate-to-floating gate coupling because only the upper page programming of neighbor storage elements will have an effect on the apparent $V_{TH}$ of a given storage element. An example of an alternate state coding is to move from the intermediate $V_{TH}$ distribution to state C when the upper page data is a 1, and to move to state B when the upper page data is a 0. Although FIGS. 9a-c provide an example with respect to four data states and two pages of data, the concepts taught can be applied to other implementations with more or fewer than four states and more or fewer than two pages. More detail about various programming schemes and floating gate-to-floating gate coupling can be found in U.S. patent application Ser. No. 11/099,133, titled "Compensating For Coupling During Read Operations Of Non-Volatile Memory," filed on Apr. 5, 2005.

Figure 10A:
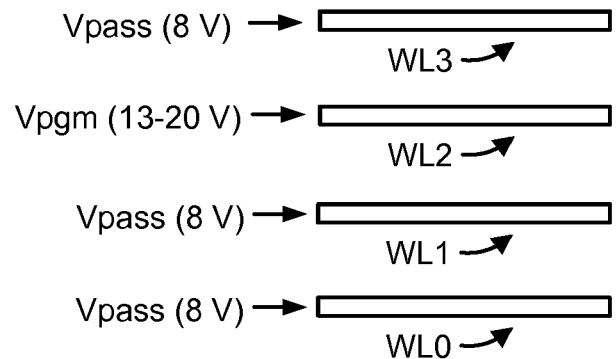
FIG. 10*a* shows voltages which are applied to word lines using a self-boosting mode.

FIG. 10a shows voltages which are applied to word lines using a self-boosting (SB) mode. With self boosting, the channels associated with the unselected bit lines are electrically isolated, and a pass voltage, Vpass, is applied to the unselected word lines during programming. The unselected word lines couple to the channels associated with the unselected bit lines, causing a voltage to exist in the channel of the unselected bit lines. Thus, self boosting causes a voltage boost to exist in the channel which tends to lower the voltage across the tunnel oxide and hence reduce program disturb. Essentially, the channel areas of the unselected NAND strings are electrically isolated from their corresponding bit lines, and the storage elements on both sides of the unselected storage elements are turned off.

For example, assume there are four word lines, WL0-WL3, in a simplified example, and that storage elements associated with WL2 are currently being programmed by the programming voltage, Vpgm. In this case, self boosting is achieved by applying Vpass to WL0, WL1 and WL3. In practice, the voltages may be applied to opposite ends of alternate word lines. Vpass has an intermediate level which is typically in the range of approximately 6.5-9.5 V. In the present example, Vpass=8 V. This level is intermediate to the levels of Vpgm, typically 13-20 V, and ground, in one example.

Figure 10B:
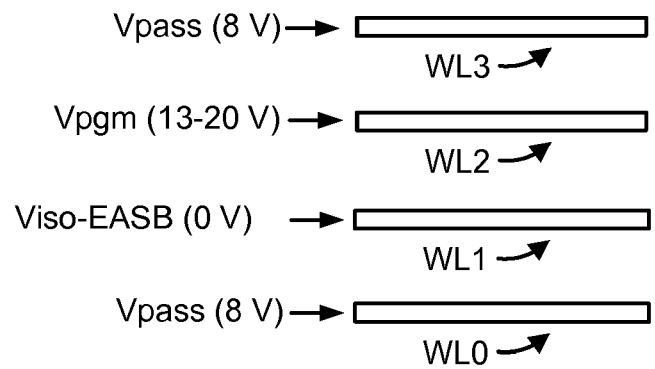
FIG. 10*b* shows voltages which are applied to word lines using an erased area self-boosting (EASB) mode.
Figure 10C:
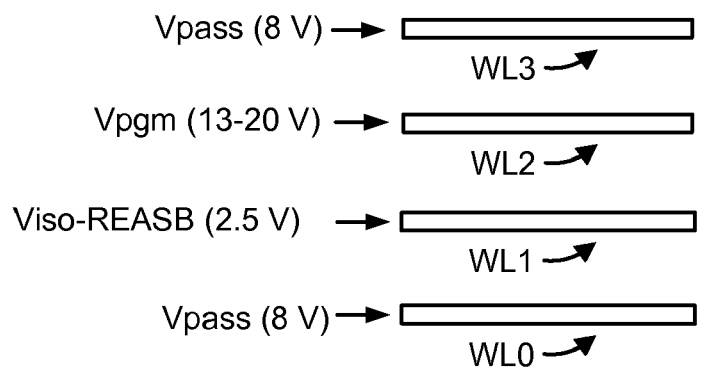
FIG. 10*c* shows voltages which are applied to word lines using a revised erased area self-boosting (REASB) mode.

FIG. 10b shows voltages which are applied to word lines using an erased area self-boosting (EASB) mode, while FIG. 10c shows voltages which are applied to word lines using a revised erased area self-boosting (REASB) mode. EASB and REASB attempt to address the shortcomings of conventional self boosting by isolating the channel of previously programmed storage elements from the channel of the storage element being inhibited. For example, referring also to FIG. 4, if storage element 424 is being programmed, EASB and REASB attempt to inhibit programming in storage element 444 by isolating the channel of storage element 444 from the previously programmed storage elements (445 and 446). The storage elements on the source side of the unselected storage elements are turned off. The voltages applied to the unselected word lines in the EASB and REASB modes are referred to as isolation voltages.

For the SB, EASB, and EASB boosting modes, or variations of these boosting modes, the bit line for the storage element being programmed is usually at ground or connected to another voltage close to 0 V, typically in a 0-1 V range, while the bit line of the NAND string with the storage element being inhibited is at Vdd, typically about 1.5-3 V. The program voltage, Vpgm, (e.g., in the range of 13-20 V) is connected to the selected word line.

In another boosting mode, the local self-boosting (LSB) mode, the word lines neighboring the selected word line are at, or close to, 0 V, while the remaining non-selected word lines are at Vpass. A disadvantage of the LSB mode is that the boosted channel voltage under the selected word line can be very high since that part of the channel is isolated from the other channel areas under the unselected word lines and, thus, the boosting voltage is mainly determined by the high programming voltage, Vpgm. Due to the high boosting, band-to-band tunneling or GIDL near the word lines that are biased to 0 V can occur. The amount of channel boosting can be limited to a lower value by using EASB. EASB is similar to LSB with the exception that only the source side neighbor word line is at 0 V. For example, referring to FIG. 10b, the selected word line WL2 is at Vpgm, while the source side neighboring word line WL1 is at an isolation voltage, Viso-EASB, of 0 V and the other word lines (e.g., WL0 and WL3), are at Vpass. REASB is similar to EASB but applies a small isolation voltage on the source side neighbor word line. See FIG. 10c, which shows that Vpass is applied to WL3 and WL0, Vpgm is applied to WL2, and the isolation voltage, Viso-REASB, such as approximately 2.5 V, is applied to WL1. With these approaches, the channel area under the selected word line and the channel area at the drain side of the selected storage elements are connected and, thus, the channel boosting is determined mainly by the voltage that is applied to the unselected word lines instead of by Vpgm as for the LSB case. The drain side neighbor word line, WL3, is at Vpass. If Vpass is too low, boosting in the channel will be insufficient to prevent program disturb. If Vpass is too high, unselected word lines in a selected NAND string (with 0 V on the bit line) may be programmed, or program disturb due to GIDL may occur.

Figure 11:
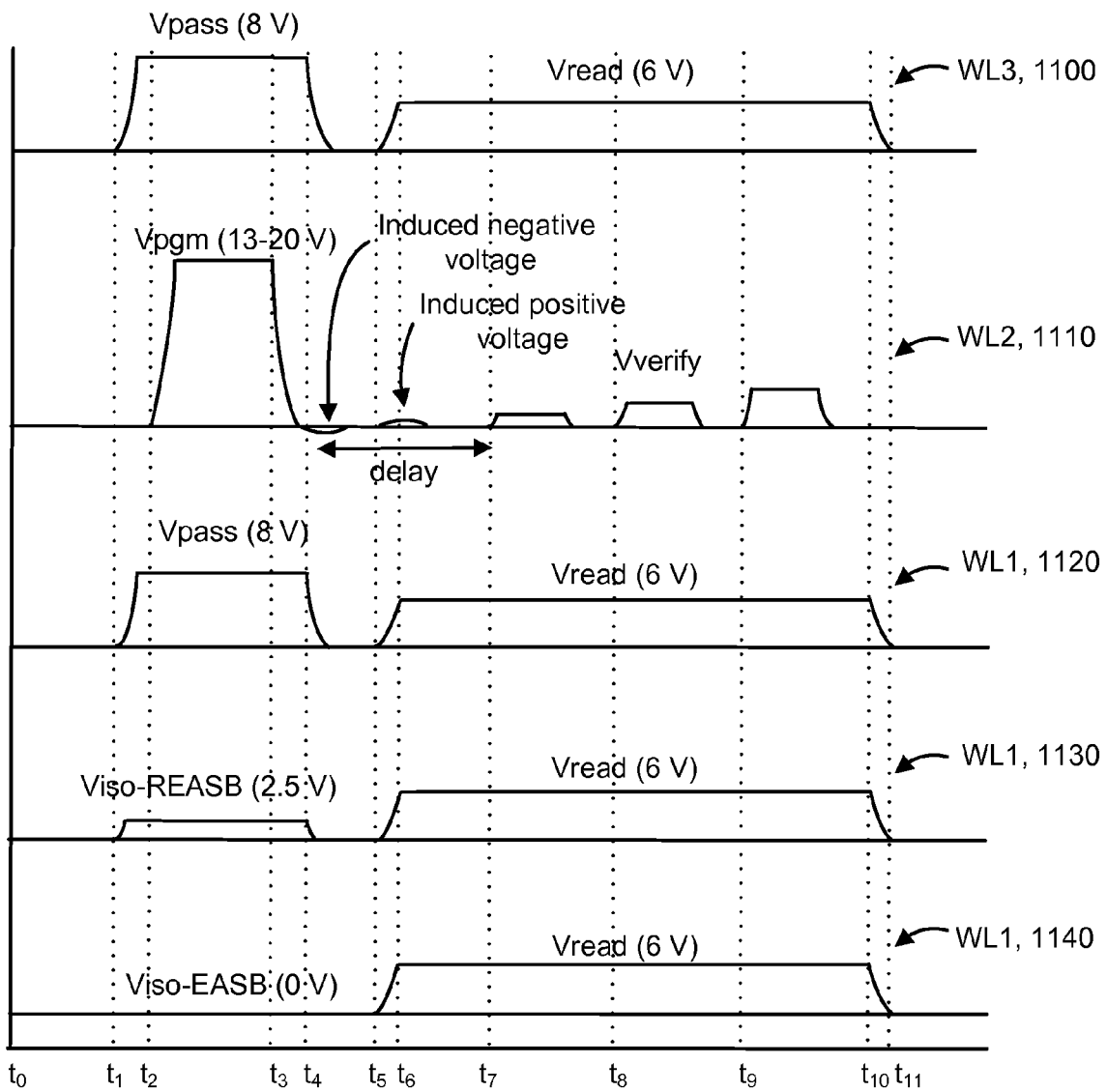
FIG. 11 depicts waveforms for programming non-volatile storage elements.

FIG. 11 depicts waveforms for programming non-volatile storage elements. The timing diagrams depict the voltage waveforms which are applied to the programmed, e.g., selected, word line, and the unselected world lines. The waveforms are not necessarily to scale. Typically, a series of such voltage waveforms are applied successively until all storage elements have been verified to have reached their associated programming states, or a maximum number of programming pulses has been applied.

WL2 represents the selected word line, WL1 represents the neighboring source side word line, and WL3 represents the neighboring drain side word line. The waveform 1100 on WL3, which includes a Vpass portion followed by a Vread portion, is used, e.g., for the self-boosting, EASB and REASB modes. The Vread portion is used to overdrive the storage elements associated with WL3 beyond their maximum threshold voltage distribution to allow the selected storage elements to be read, such as in a verify process. Vread may be approximately 5.5-6.0 V, for example. A value of 6.0 V is indicated for illustration purposes. Note that the applied voltages cannot change instantaneously but require a rise time and a decay time. For example, Vpass on WL3 begins to rise from a ground voltage at time t1, and begins to decay from Vpass at time t4. Vread on WL3 begins to rise from the ground level to Vread at time t5, and begins to decay from Vread at time t10.

The waveform 1110 on the selected word line, WL2, includes a programming pulse, Vpgm, which starts at an initial level such as 13 V and increases successively to a maximum level such as 20 V, e.g., in 0.5 V increments. In each waveform, Vpgm transitions at t3 to a reduced, steady state level such as a ground voltage, followed by one or more verify pulses at t7, t8 and t9. In the example shown, there are three verify pulses for verifying whether the associated storage elements have reached the A, B and C states, for instance. Storage elements with more or fewer states can also be used, in which case the number of verify pulses is adjusted accordingly. The Vpgm pulse begins to rise at time t2, and begins to decay at time t3. Vpass can be applied on WL3 and WL1 for a slightly longer duration than Vpgm is applied on WL2. The waveform 1110 is used with any of the boosting modes, such as the self-boosting, EASB and REASB modes.

The waveform 1120 on WL1, which is the same as the waveform 1100 on WL3, includes the Vpass portion followed by a Vread portion, and is used for the self-boosting mode. The waveform 1100 on WL3 is used with any of the boosting modes, such as the self-boosting, EASB and REASB modes. The waveform 1130, which includes the Viso-REASB portion followed by a Vread portion, is used for the REASB mode. The waveform 1140, which includes the Viso-EASB portion followed by a Vread portion, is used for the EASB mode. Thus, one of the WL1 waveforms 1120, 1130 or 1140 is used with the waveforms 1110 and 1100, depending on the boosting mode.

The programming pulse of the voltage waveform 1110 on the selected word line, WL2, is applied during a first time interval, between t2 and t3, not including the decay time starting at t3. In a second interval, between t3 and t5, the waveform 1110 transitions to a steady state level, such as ground. It is desirable for the waveform 1110 to stabilize before attempting to read the storage elements using the verify pulses so that an accurate reading can be obtained. However, at t5, when the waveforms 1100 and 1120, 1130 or 1140 transition to the respective Vread levels, which can be the same or different, but are generally higher than the verify pulses, the voltage changes of the neighboring word lines are coupled to the selected word line, WL2, due to word-line-to-word capacitive coupling. This is caused by the close spacing between the word lines which is necessitated by modern memory devices. For example, the word line thickness, as well as the spacing between word lines, may be approximately 55-60 nm. Moreover, the capacitive coupling occurs during both programming and reading, e.g., verifying, of the storage elements. Generally, coupling effects are strongest from the word lines adjacent to the selected word line. These word lines each provide about 40% of the coupling.

For example, in the self-boosting mode, the voltage waveforms 1100 and 1120 transition from 8 V, for instance, to 0 V, at t4, resulting in a net transition of −16 V (−8-8 V), which is coupled to the selected word line, WL2. The situation is improved somewhat for the other boosting modes where a lower, isolation voltage is used. For example, for the REASB mode, which uses waveform 1130, the net transition is −8−2.5=−10.5 V. Moreover, for the EASB mode, which uses the waveform 1140, the net transition is −8−0=−8 V. The coupling is sufficient to cause an induced ripple voltage in the selected word line. The induced voltage is negative because the net transition of the coupled voltages is negative.

Similarly, a positive induced voltage results when the net transition of the coupled voltages is positive, such as at time t5, when the voltage waveforms on WL1 and WL3 transition from a steady state ground level, for instance, to Vread. For example, in any of the boosting modes, the transition for the waveforms between t5 and t6 is Vread−0=6−0=+6 V, for a net transition of +12 V. Due to these transitions, a positive induced voltage of about 0.2 to 0.3 V may result near t5. This induced voltage is problematic because it would interfere with the verify process if the verify pulses overlapped with the induced voltage. To avoid this, it is necessary to delay the verify pulses until the induced voltage has diminished to an insignificant level. The selected word line dissipates the induced voltage at a rate which is based on its conductance. For example, the delay can be measured from t4, when Vpass on waveforms 1100 and 1120, or Vpass on waveform 1100 and Viso-REASB on waveform 1130, are removed from the respective word lines. As a result, the total time needed for programming and verifying the storage elements is increased.

Figure 12A:
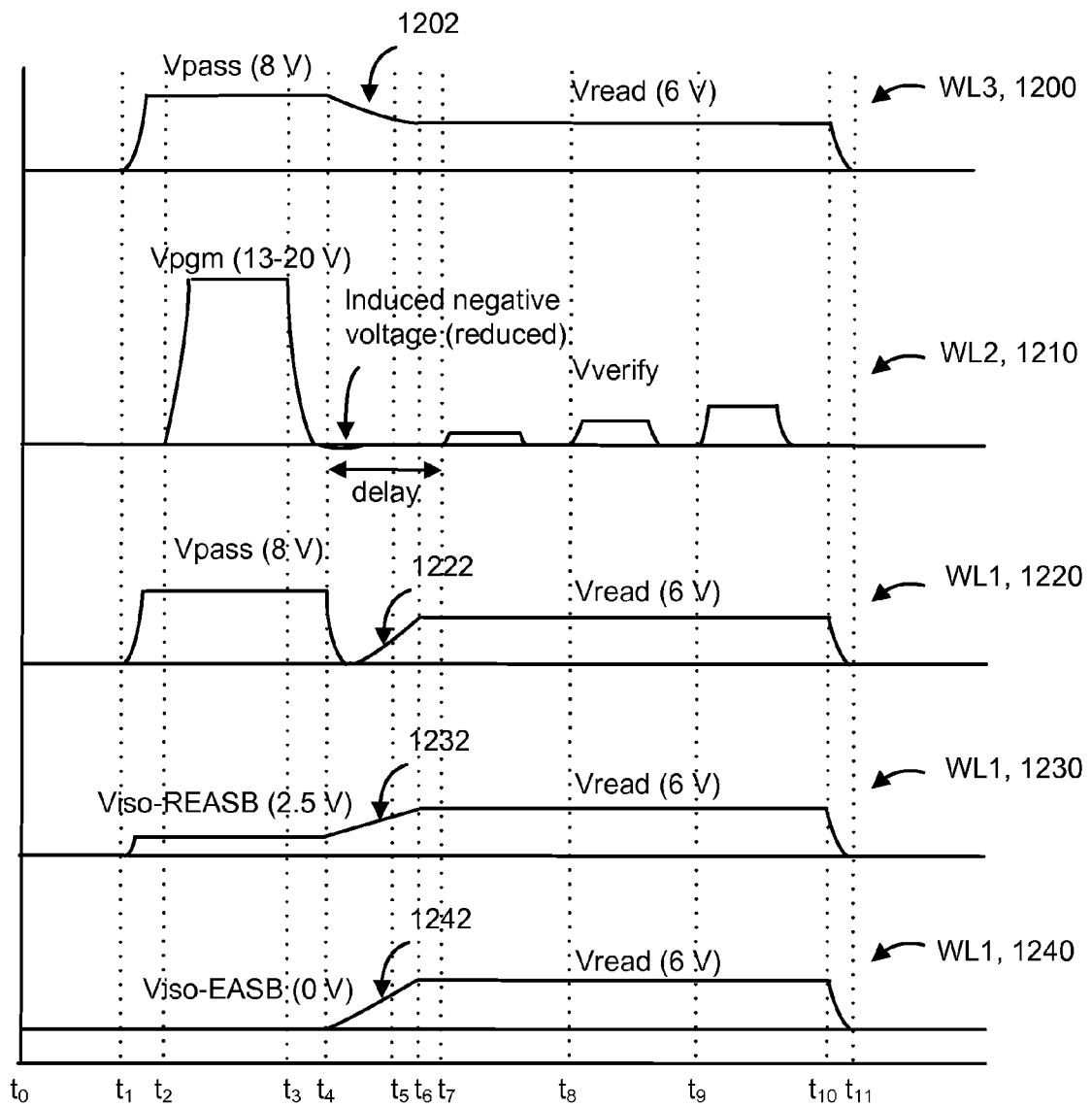
FIG. 12*a* depicts waveforms with counter transitioning portions for programming non-volatile storage elements.

FIG. 12a depicts waveforms with counter transitioning portions for programming non-volatile storage elements. The waveform 1200 represents the voltage on WL3, during any of the boosting modes, and the waveform 1210 represents the voltage on WL2. The waveforms 1220, 1230 and 1240 represent the voltages on WL1 during the self-boosting mode, REASB mode, and EASB mode, respectively. Relative to FIG. 11, new waveform transitions 1202, 1222, 1232 and 1242 are provided in the interval t4 to t6. The techniques provided here can significantly reduce or essentially eliminate the capacitive coupling of the neighboring word lines WL1 and WL3 to the selected word line, WL2. As a result, the verify pulses can be applied sooner to increase programming speed. The techniques are generally applicable to comparable scenarios.

For any of the boosting modes, for the neighboring word line on the drain side, WL3, a waveform portion 1202 can be applied between Vpass and Vread, in the time interval t4 to t6. This reduces the capacitive coupling due to WL3 because there is no need to transition upwards from ground to Vread. The transition from Vpass to Vread is less than the transition from ground to Vread. Additionally, the direction of the transition is a factor, as discussed further below. For the waveform portion 1202, the voltage change is Vread−Vpass=6−8=−2 V.

For the self-boosting mode, the waveform portion 1222 may be provided by increasing the voltage at an earlier time than in waveform 1120 so that the waveform portion 1222 is provided at approximately the same time (t4) as the waveform portion 1202 on WL3, in one possible approach. It is also possible to use the waveform of 1120 in the self-boosting mode and still obtain reduced coupling due to the modification to WL3. For the waveform portion 1222, the voltage change is Vread−0=6−0=+6 V, so the net transition of the neighboring word lines WL3 and WL1 is −2+6=+4 V. Alternatively, the waveforms 1200 and 1220 can be swapped so that waveform 1200 is applied on WL1 and waveform 1220 is applied on WL3.

For the REASB mode, the capacitive coupling due to WL1 is reduced when Vread is applied because the transition from Viso-REASB to Vread is less than the transition from ground to Vread. Also, the capacitive coupling of the waveform portion 1232 on WL1 induces a negative voltage on WL2, while the capacitive coupling of the waveform portion 1202 on WL3 induces a positive voltage on WL2. Thus, the coupled voltages offset one another, at least partly. For example, the transition 1202 yields a voltage change of −2 V as discussed. The transition 1232 yields a voltage change of Vread−(Viso−REASB)=6−2.5=+3.5 V, so the net transition is 3.5−2=+1.5 V.

For the EASB mode, the voltage change is Vread−(Viso−EASB)=6−0=+6 V, so the net transition is 6−2=+4 V.

For the self-boosting mode, the transitioning voltages 1202 and 1222 are considered to be counter-transitioning because one increases while the other decreases. For the REASB mode, the transitioning voltages 1202 and 1232 are also counter-transitioning. Similarly, for the EASB mode, the transitioning voltages 1202 and 1242 are counter-transitioning. The transitions 1202, 1222, 1232 and 1242 may be generally ramp shaped as indicated, increasing or decreasing at a generally constant rate, in one approach. In another approach, the transitions increase or decrease non-linearly. The above results are summarized in Table 1. The results in Table 1 are examples, but indicate that a substantial reduction in capacitive coupling can be achieved using the techniques provided. Moreover, the capacitive coupling is reduced further, relative to the approach of FIG. 11, because the waveform portions 1202, 1222, 1232 and 1242 occur at a slower rate than the comparable transitions in FIG. 11. The reduction in capacitive coupling is achieved even if the waveform portions are not perfectly synchronized between the neighboring word lines.

TABLE 1

| Mode | Net voltage change (t5-t6) FIG. 11 technique | Net voltage change (t4-t6) FIG. 12a technique |
| --- | --- | --- |
| Self-boosting | +12 V | +4 V |
| REASB | +12 V | +1.5 V |
| EASB | +12 V | +4 V |

Since the capacitive coupling on the selected word line is significantly reduced, the induced ripple voltage becomes insignificant, and the verify pulses can be applied sooner, relative to the approach of FIG. 11, as indicated by the reduced delay from t4 to t7. As a result, the total time needed for programming and verifying the storage elements is decreased. Note that the most benefit is expected by applying the counter transitioning waveforms on the two adjacent word lines of the selected word line since these word lines each provide about 40% of the coupling. However, it is also possible to extend the modification to additional neighboring word lines which may provide some coupling to the selected word line.

Figure 12B:
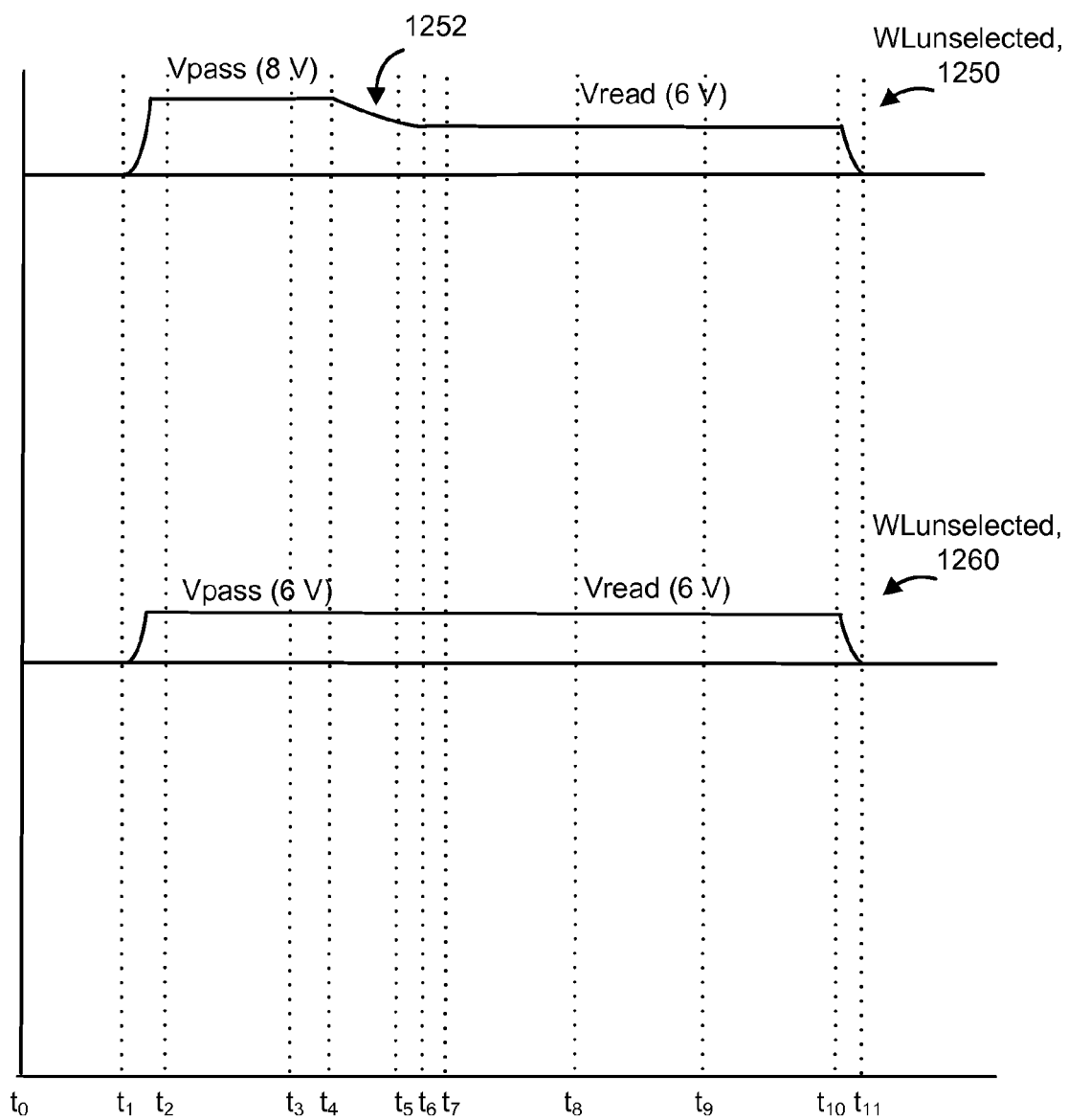
FIG. 12*b* depicts waveforms with direct transitioning portions for programming non-volatile storage elements.

FIG. 12b depicts waveforms with direct transitioning portions for programming non-volatile storage elements. The waveforms 1250 and/or 1260 can be applied to any or all of the unselected word lines. The waveforms 1250 and/or 1260 represent the voltages on an unselected word line (WLunselected) during a modified self-boosting mode. In the waveform 1250, a waveform portion 1252 represents a direct transition from a Vpass level to a Vread level, where the magnitude of Vpass is greater than that of Vread. The voltage transitions from Vpass to Vread without transitioning to another voltage outside the range between Vpass and Vread. With this approach, faster programming can be achieved since the transition from Vpass to Vread can occur more quickly compared to the waveform 1220. The amount of the transition in this approach is Vpass−Vread. For example, with Vpass=8 V and Vread=6 V, the transition is only 2 V. In comparison, with the waveform 1220, the transition is 8 V down and 6 V up. The waveform portion 1252 is not counter-transitioning with the waveform portion 1202 but can still provide the benefit of increased programming speed.

In another possible approach, with the waveform 1260, there is also a direct transition from a Vpass level to a Vread level. Here, the magnitudes of Vpass and Vread are essentially the same. Faster programming can also be achieved in this approach since no time is need to transition from Vpass to Vread. The waveform 1260 does not include a portion which is counter-transitioning with the waveform portion 1202, but it can still provide the benefit of increased programming speed. Moreover, there is no voltage transition-induced capacitive coupling to the selected word line, WL2.

Figure 13:
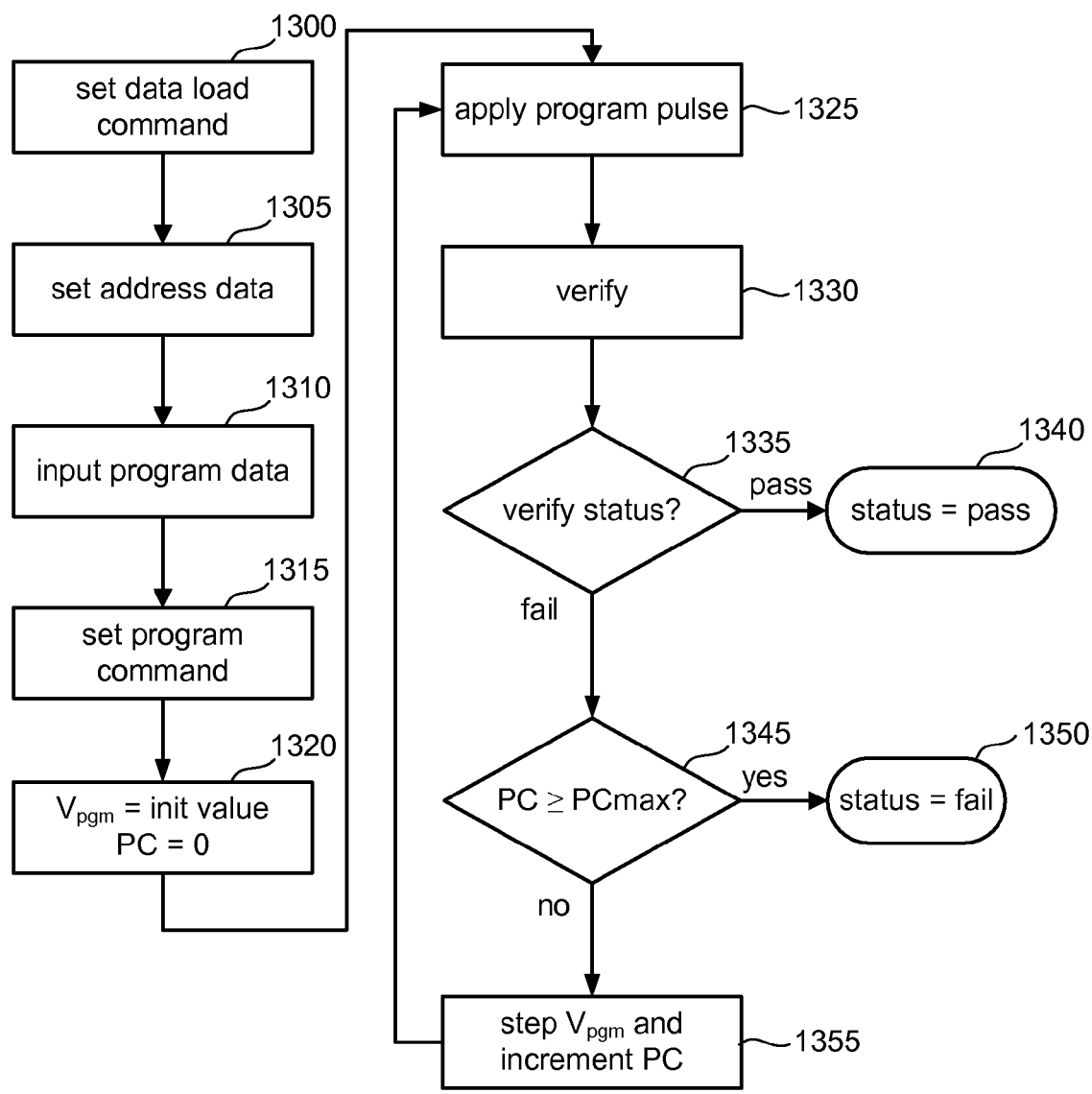
FIG. 13 is a flow chart describing one embodiment of a process for programming non-volatile storage using a series of programming pulses.

FIG. 13 is a flow chart describing one embodiment of a process for programming non-volatile storage using a series of programming pulses. The erase process is typically carried out on multiple word lines at the same time, such as a block, while programming is done on a word line-by-word line basis. Referring also to FIG. 5, at step 1300, a "data load" command is issued by the control circuitry 515 and input to command circuits 514, allowing data to be input to data input/output buffer 512. The input data is recognized as a command and latched by state machine 516 via a command latch signal input to command circuits 514. At step 1305, address data designating the page address is input to row controller or decoder 506 from the controller or host. The input data is recognized as the page address and latched via state machine 516, affected by the address latch signal input to command circuits 514. At step 1310, a page of program data for the addressed page is input to data input/output buffer 512 for programming. For example, 532 bytes of data could be input in one embodiment. That data is latched in the appropriate registers for the selected bit lines. In some embodiments, the data is also latched in a second register for the selected bit lines to be used for verify operations. At step 1315, a "program" command is issued by the controller and input to data input/output buffer 512. The command is latched by state machine 516 via the command latch signal input to command circuits 514.

Triggered by the "program" command, the data latched in step 1315 will be programmed into the selected storage elements controlled by state machine 516 using stepped pulses applied to the appropriate word line, as shown in FIG. 8. At step 1320, Vpgm, the programming pulse voltage level applied to the selected word line, is initialized to the starting pulse (e.g., 12 V) and a program counter PC maintained by state machine 516 is initialized at 0. The magnitude of the initial program pulse can be set, e.g., by properly programming a charge pump. At step 1325, the first Vpgm pulse is applied to the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to VDD to inhibit programming.

At step 1330, the states of the selected storage elements are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 1335, it is checked whether all of the data latches are storing logic "1." If so, the programming process is complete and successful because all selected storage elements were programmed and verified to their target states. A status of "PASS" is reported at step 1340. A pass can also be reported if a predetermined portion of the storage elements were programmed and verified.

Optionally, a pass can be declared at step 1335 even when some of the memory elements have not yet reached their desired state. Thus, even if a certain number of cells can not reach the desired state, programming can stop before the maximum number of loops is reached.

If, at step 1335, it is determined that not all of the data latches are storing logic "1," then the programming process continues. At step 1345, the program counter PC is checked against a program limit value PCmax. One example of a program limit value is twenty pulses, however, other values can be used in various implementations. If the program counter PC has reached PCmax, the program process is flagged as failed and a status of fail is reported at step 1350. For example, a fail status may occur when the number of unsuccessfully programmed bits is greater than a predetermined number. If the program counter PC is less than PCmax, then the Vpgm level is increased by the step size and the program counter PC is incremented at step 1355. The process then loops back to step 1325 to apply the next Vpgm pulse.

The flowchart depicts a programming method that can be used for binary storage elements. For multi-level storage, for example, multiple programming or verification steps, such as discussed in connection with FIG. 8 and FIGS. 9*a-c*, may be used in a single iteration of the flowchart. Steps 1320-1355 may be performed for each step of the programming operation. In a first step, one or more program pulses may be applied and the results thereof verified to determine if a cell is in the appropriate intermediate state. In a second step, one or more program pulses may be applied and the results thereof verified to determine if the cell is in the appropriate final state. At the end of a successful program process, the threshold voltages of the storage elements should be within one or more distributions of threshold voltages for programmed storage elements or within a distribution of threshold voltages for erased storage elements.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
    applying a first voltage waveform to a first word line associated with a plurality of non-volatile storage elements, the first voltage waveform including a programming voltage, and a transition from the programming voltage to a reduced level; and
    when the first voltage waveform transitions to the reduced level, applying a portion of a second voltage waveform to a second word line which neighbors the first word line on one side, and applying a portion of a third voltage waveform to a third word line which neighbors the first word line on another side, the portions of the second and third voltage waveforms being counter-transitioning.

2. The method of claim 1, wherein:
    the first voltage waveform includes a transition from the reduced level to at least one verify voltage.

3. The method of claim 2, wherein:

the portions of the second and third voltage waveforms comprise transitions from respective voltages associated with a self-boosting mode, when the programming voltage is applied, to respective read voltages, when the at least one verify voltage is applied to the first word line.

4. The method of claim 2, wherein:

the portions of the second and third voltage waveforms comprise transitions from respective voltages associated with a revised erased area self-boosting mode, when the programming voltage is applied, to respective read voltages, when the at least one verify voltage is applied to the first word line.

5. The method of claim 2, wherein:

the portions of the second and third voltage waveforms comprise transitions from respective voltages associated with an erased area self-boosting mode, when the programming voltage is applied, to respective read voltages, when the at least one verify voltage is applied to the first word line.

6. The method of claim 2, wherein:

the at least one verify voltage is applied to verify whether at least one of the plurality of non-volatile storage elements has been programmed to a desired programming state.

7. The method of claim 1, wherein:

the portion of the second voltage waveform decreases while the portion of the third voltage waveform increases.

8. The method of claim 1, wherein:

the portions of the second and third voltage waveforms comprise respective ramps.

9. The method of claim 1, wherein:

the plurality of non-volatile storage elements are arranged in NAND strings;

the second word line is on a drain side of the first word line; and the third word line is on a source side of the first word line.

10. The method of claim 1, wherein:

the portions of the second and third voltage waveforms are counter-transitioning such that a capacitive coupling of the portion of the second voltage waveform to the first word line is counteracted, at least in part, by a capacitive coupling of the portion of the third voltage waveform to the first word line.

11. The method of claim 1, wherein:

the reduced level is a ground level.

* * * * *